United States Patent
Liu et al.

(10) Patent No.: US 10,720,889 B2
(45) Date of Patent: Jul. 21, 2020

(54) CONTROLLED TRANSISTOR ON-RESISTANCE WITH PREDEFINED TEMPERATURE DEPENDENCE

(71) Applicant: Integrated Device Technology, Inc., San Jose, CA (US)

(72) Inventors: Zhiyang Liu, Dunstable, MA (US); Shawn Bawell, Amherst, NH (US)

(73) Assignee: Integrated Device Technology, Inc., San Jose, CA (US)

( * ) Notice: Subject to any disclaimer, the term of this patent is extended or adjusted under 35 U.S.C. 154(b) by 37 days.

(21) Appl. No.: 16/203,979

(22) Filed: Nov. 29, 2018

(65) Prior Publication Data

US 2020/0177137 A1 Jun. 4, 2020

(51) Int. Cl.
*H03F 1/30* (2006.01)
*G05F 3/24* (2006.01)
*H03F 3/19* (2006.01)

(52) U.S. Cl.
CPC .............. *H03F 1/303* (2013.01); *G05F 3/245* (2013.01); *H03F 3/19* (2013.01)

(58) Field of Classification Search
CPC ........................................................ H03F 1/303
USPC ......................................................... 330/289
See application file for complete search history.

(56) References Cited

U.S. PATENT DOCUMENTS

| | | | | |
|---|---|---|---|---|
| 6,441,680 B1* | 8/2002 | Leung | ..................... | G05F 3/262 327/541 |
| 6,954,059 B1* | 10/2005 | MacLean | .................. | G05F 3/30 323/280 |
| 8,933,683 B2* | 1/2015 | Singnurkar | ............... | G05F 3/30 323/316 |
| 10,566,045 B2* | 2/2020 | Lee | ..................... | G11C 11/1673 |
| 2007/0076342 A1* | 4/2007 | Arndt | ............... | H03K 17/08142 361/103 |
| 2007/0139030 A1* | 6/2007 | Lee | ........................... | G05F 3/30 323/315 |
| 2010/0271144 A1* | 10/2010 | McCorquodale | ........ | H03B 5/04 331/117 FE |
| 2015/0333555 A1* | 11/2015 | Ono | ..................... | H02J 7/0029 320/134 |

* cited by examiner

*Primary Examiner* — Patricia T Nguyen
(74) *Attorney, Agent, or Firm* — Christopher P. Maiorana, PC

(57) ABSTRACT

An apparatus includes a first circuit and a second circuit. The first circuit may be configured to generate (i) a variable current and (ii) a constant current. The variable current may be proportional to a temperature of the first circuit. The second circuit may be configured to present a resistance through a plurality of first transistors between two ports in response to both the variable current and the constant current. The resistance may have a predefined dependence on the temperature.

20 Claims, 8 Drawing Sheets

US 10,720,889 B2

CONTROLLED TRANSISTOR ON-RESISTANCE WITH PREDEFINED TEMPERATURE DEPENDENCE

FIELD OF THE INVENTION

The invention relates to broadband amplifiers generally and, more particularly, to a method and/or apparatus for implementing a controlled transistor on-resistance with predefined temperature dependence.

BACKGROUND

Conventional high-frequency broadband amplifiers with a feedback resistor between an output node and an input node exhibit significant gain variation over temperature. Minimal gain variation over temperature is desired to improve system performance of the amplifiers. However, simple temperature-dependent feedback resistors are difficult to create to compensate for the temperature variations of the amplifiers.

It would be desirable to implement a controlled transistor on-resistance with predefined temperature dependence.

The invention concerns an apparatus including a first circuit and a second circuit. The first circuit may be configured to generate (i) a variable current and (ii) a constant current. The variable current may be proportional to a temperature of the first circuit. The second circuit may be configured to present a resistance through a plurality of first transistors between two ports in response to both the variable current and the constant current. The resistance may have a predefined dependence on the temperature.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a controlled transistor on-resistance with predefined temperature dependence that may (i) compensate for temperature-dependent gain variations in an amplifier, (ii) implement a controllable feedback path in the amplifier, (iii) provide a linear response and/or (iv) be implemented as one or more integrated circuits.

Embodiments of the invention generally provide a controlled resistor used in a feedback path of a broadband amplifier. The controlled resistor may be realized with a composite resistance that has a predefined temperature dependence. The composite resistance may be created using the on-resistance of multiple transistors. A gain variation introduced by the amplifier core may be cancelled out by the temperature dependence of a controlled resistor.

In an example embodiment, the composite resistance may be realized with the on-resistance of multiple transistors (e.g., field-effect transistors). The transistor on-resistance may vary with a gate voltage controlled by a closed loop with a predefined temperature profile. The transistors may be stacked to improve a linearity of the composite resistance. In addition, the transistor on-resistance may be connected in series with a normal resistor to further improve linearity.

Figure 1:
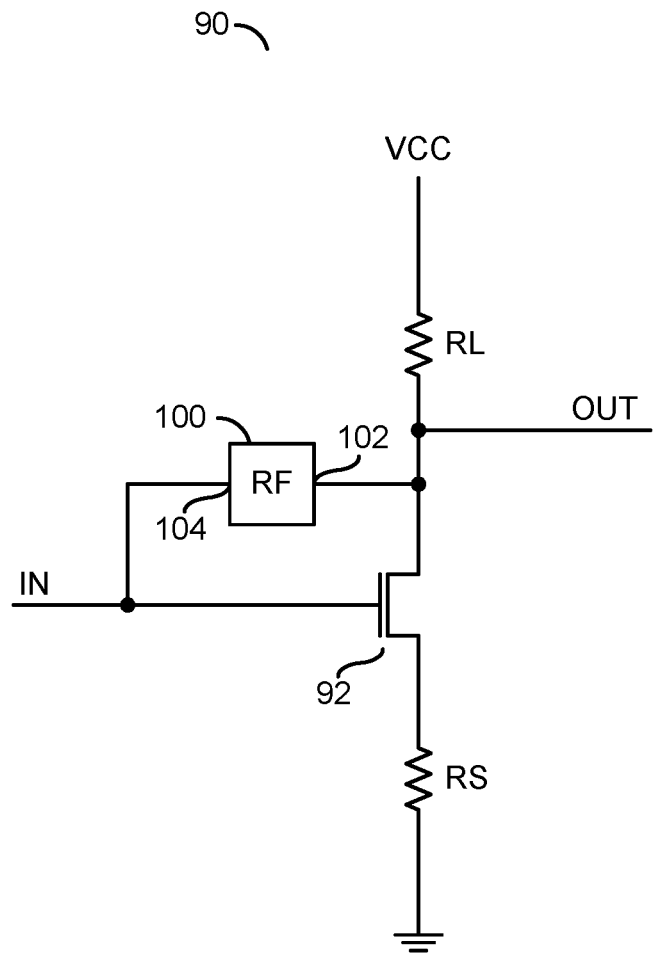
FIG. 1 is a block diagram of an amplifier in accordance with an example embodiment of the invention.

Referring to FIG. 1, a block diagram of an amplifier 90 is shown in accordance with an example embodiment of the invention. The amplifier (or apparatus, or system or circuit) 90 may implement an amplifier having a composite resistor with a predefined temperature dependence using a loop-controlled transistor on-resistance. The amplifier 90 generally comprises a block (or circuit) 92, a block (or circuit) 100 and two resistors RL and RS. The circuits 92-100 and the resistors RL and RS may be implemented with hardware and/or simulated with software.

An input signal (e.g., IN) may be received by the circuit 92. The signal IN may implement a radio-frequency signal carrying information. An output signal (e.g., OUT) may be generated and presented from the circuit 92. The signal OUT may carry an amplified version of the signal IN. The resistor RL may be connected between the circuit 92 and a power source (e.g., a voltage supply VCC). In various embodiments, the resistor RL may be replaced with a choke inductor for high-frequency applications. The resistor RS may be connected between the circuit 92 and a signal ground.

The circuit 92 may implement one or more field-effect transistors (one shown for simplicity). In some embodiments, the circuit 92 may be implemented with multiple transistors arranged as a cascode amplifier. The transistor 92 is generally configured to amplify the signal IN to generate the signal OUT. The signal IN may be received by a base node of the transistor 92. The resistor RL (or a choke inductor) may be connected to a drain node of the transistor 92 as a load resistor. The resistor RS may be connected to a source node of the transistor 92 as a source resistor. The circuit 100 may be connected as a feedback loop from the drain node to the gate node of the transistor 92.

In some embodiments, the input signal IN may by in a range of frequencies from approximately 2 gigahertz (GHz) to approximately 5 GHz. In other embodiments, the input signal IN may be in a range of frequencies centered around approximately 28 GHz or approximately 39 GHz (e.g., 24 GHz to 30 GHz or 37 GHz to 44 GHz). Other frequency ranges may be implemented to meet the design criteria of a particular application.

The circuit 100 may implement a controlled feedback resistance. The circuit 100 may have a port (or node) 102 connected to the drain node of the transistor 92. Another port (or node) 104 of the circuit 100 may be connected to the gate node of the transistor 92. The circuit 100 is generally operational to provide a temperature dependent resistance feedback (RF) for the amplifier 90. A higher feedback resistance at higher temperatures generally compensates for a gain degradation of the amplifier 90 at higher temperatures and thus may reduce an overall gain variation over temperature.

The circuit 100 generally provides better tolerance and relative immunity to process variations than common resistors. The on-resistance may be more accurate than common resistors. The on-resistance may be tunable if an off-chip resistor is used for reference.

Figure 2:
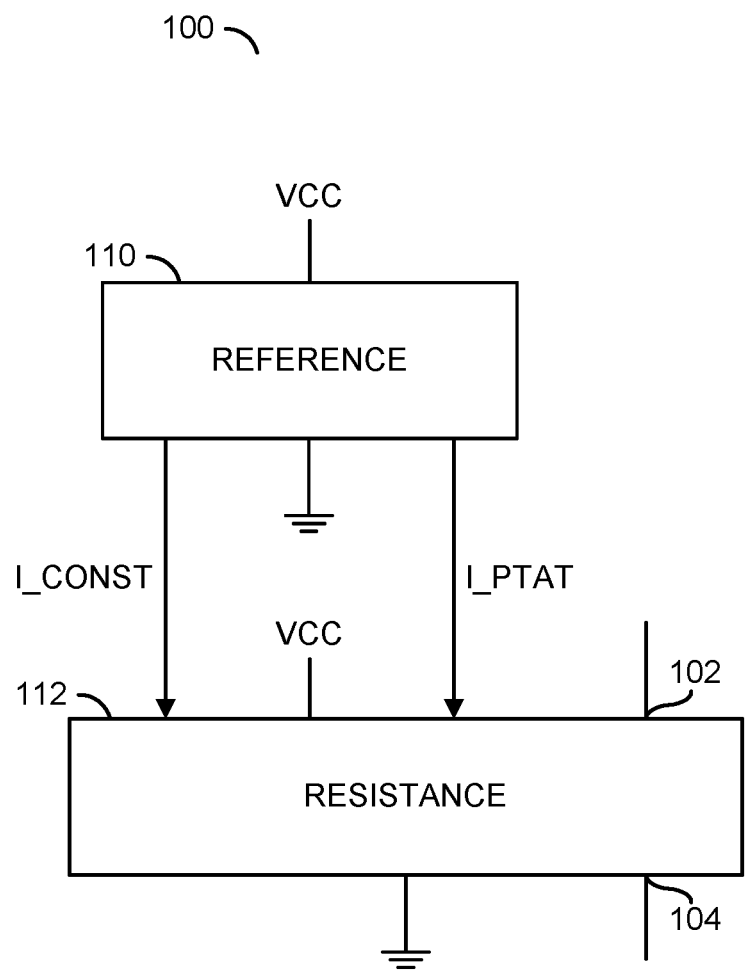
FIG. 2 is a diagram illustrating a feedback circuit of the amplifier in accordance with an example embodiment of the invention.

Referring to FIG. 2, a diagram illustrating an implementation of the circuit 100 is shown in accordance with an example embodiment of the invention. The circuit 100 generally comprises a block (or circuit) 110 and a block (or circuit) 112. The circuits 110-112 may be implemented with hardware and/or simulated with software. In various embodiments, all of the transistor 92, the circuit 110 and the circuit 112 may be implemented on the same substrate (or chip).

A signal (e.g., I_CONST) may be generated by the circuit 110 and received by the circuit 112. The signal I_CONST may implement a constant current. A value of the constant current may be independent of a temperature of the circuit 110 and a value of a supply voltage (e.g., VCC). A signal (e.g., I_PTAT) may be generated by the circuit 110 and received by the circuit 112. The signal I_PTAT may implement a variable current with an amplitude proportional to an absolute temperature (PTAT) of the circuit 110. The current in the signal I_PTAT may be independent of the supply voltage VCC.

The circuit 110 may implement a bandgap reference circuit. The reference circuit 110 is generally operational to create the signals I_CONST and I_PTAT. The signals I_CONST and I_PTAT may be presented to the circuit 112.

The circuit 112 may implement a controllable resistance circuit. The resistance circuit 112 is generally operational to present a resistance between the two ports 102 and 104 based on the signals I_CONST and the signal I_PTAT. The resistance may have a predefined dependence on the temperature of the circuit 110 (approximately the same as the temperature of the transistor 92). The predefined dependence of the resistance on the temperature may be configured to counteract a gain dependency of the transistor 92 on the temperature to smooth a gain variation of the amplifier 90 over the temperature.

Figure 3:
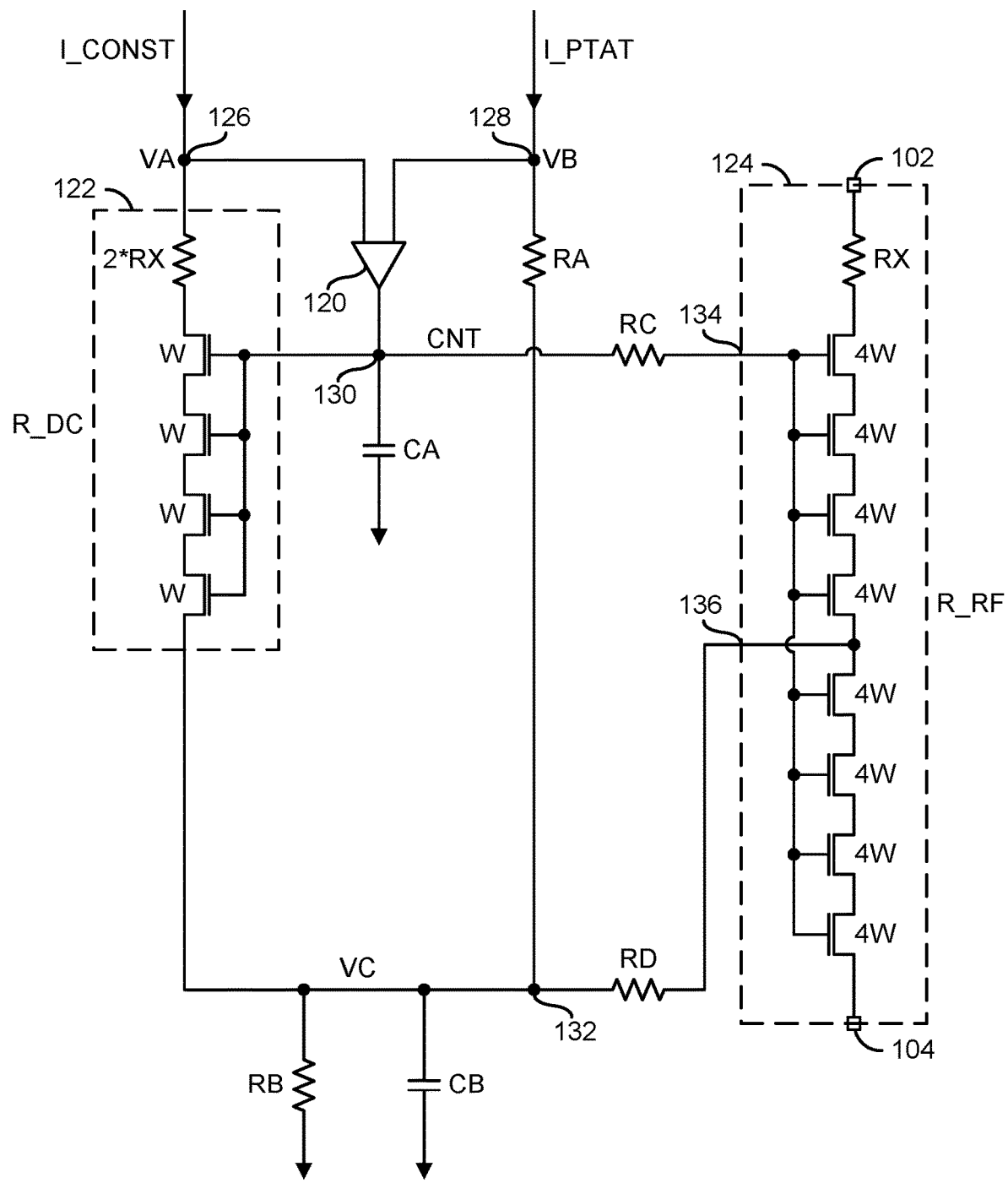
FIG. 3 is a diagram illustrating a resistance circuit in accordance with an example embodiment of the invention.

Referring to FIG. 3, a diagram illustrating an implementation of the resistance circuit 112 is shown in accordance with an example embodiment of the invention. The resistance circuit 112 generally comprises a block (or circuit) 120, a block (or circuit) 122, a block (or circuit) 124, multiple resistors RA-RD and multiple capacitors CA-CB. The circuits 120-124, the resistors RA-RD and the capacitors CA-CB may be implemented with hardware and/or simulated with software. In various embodiments, the circuits 120-124, the resistors RA-RD and the capacitors CA-CB may be implemented as one or more integrated circuits.

The signal I_CONST may be received by an input node of the circuit 120 and by the circuit 122. The signal I_PTAT may be received by another input node of the circuit 120 and by the circuit 124. A signal (e.g., CNT) may be generated by the circuit 120 and transferred to the circuit 122 and to the circuit 124 through the resistor RC. The signal CNT may implement a control signal used to control the resistance between the two ports 102 and 104.

The circuit 120 may be implemented as a differential amplifier. The circuit 120 is generally operational to generate the signal CNT as a difference between a voltage (e.g., VA) at an input node 126 and another voltage (e.g., VB) at another input node 128. The signal CNT may be applied to a node 130. The circuit 120 generally causes the voltages VA and VB to match each other with the feedback network of the circuit 122. Thus the voltage across the resistor RA may match the voltage across the circuit 122 (R_DC).

The circuit 122 may implement a resistance circuit. The resistance circuit 122 may be operational to present a variable resistance (e.g., R_DC) between the node 126 and a common node 132. The resistance R_DC may be varied by the signal CNT. The resistance circuit 122 generally comprises a resistor 2*RX and multiple (e.g., four) transistors connected in series. In various embodiments, the transistors may be implemented as field-effect transistors. Gates of all the transistors may be tied together and to the node 130 to receive the signal CNT. Each transistor may have a same channel width (e.g., W). A voltage (e.g., VC) may be generated at the node 132 by the currents I_CONST and I_PTAT.

The circuit 124 may implement another resistance circuit. The resistance circuit 124 may be a mirrored and scaled version of the resistance circuit 122. The resistance circuit 124 may be operational to present a variable resistance (e.g., R_RF) between the port 102 and the port 104. The resistance R_RF may be varied by the signal CNT. The resistance circuit 124 generally comprises a resistor RX and multiple (e.g., eight) transistors connected in series. In various embodiments, the transistors may be implemented as field-effect transistors. Gate of all the transistors may be tied together and to a node 134 to receive the signal CNT. A center-tap (or intermediate) node 136 of the resistance circuit 124 may be connected at a midpoint among the series transistors. Each transistor may have a same channel width (e.g., 4 W).

The transistors in the circuit 124 may have a wider channel width (e.g., four times wider) than the channel width of the transistors in the circuit 122. The resistor 2*RX in the circuit 122 may have a resistance multiple times (e.g., two times) larger than the resistor RX in the circuit 124. The overall resistance R_RF of the circuit 124 may be a fraction (e.g., ½) of the overall resistance R_DC of the circuit 122. Other relationships between the transistors and resistors of the circuits 122 and 124 may be implemented to meet the design criteria of a particular application.

The capacitor CA may be connected between the node 130 and a signal ground. The capacitor CB and the resistor RB may be connected between the node 132 and the signal ground. The resistor RC may be connected between the node 130 and the node 134. The resistor RD may be connected between the node 132 and the node 136. The capacitors CA and CB and the resistors RC and RD generally prevent the RF signal passing through the resistance circuit 124 from leaking into the circuit 120, the circuit 122 and the circuits that generate the currents I_CONST and I_PTAT.

A higher feedback resistance (R_RF) at higher temperatures generally compensates the gain degradation of the amplifier 90 at higher temperatures and thus reduces gain variation over temperature. Increasing the number of transistors in the stacks while maintaining the same total on-resistance from the port 102 to the port 104 may improve linearity. Increasing the number of transistors in the stacks generally increases an area of the circuit 100. For the same resistance R_RF, increasing the resistor RX may reduce the voltage across the transistors and thus improve linearity. For the same resistance R_RF, increasing the resistor RX may reduce the range of the transistor on-resistance. Utilizing the FET on-resistance of the transistors generally provides better tolerance than common resistors and relative immunity to process variations (e.g., more accurate resistance). The temperature dependence of the resistance R_RF may by controllable by the signal CNT. Furthermore, the value of the resistance R_RF may be tunable if an off-chip resistor is used for reference.

Figure 4:
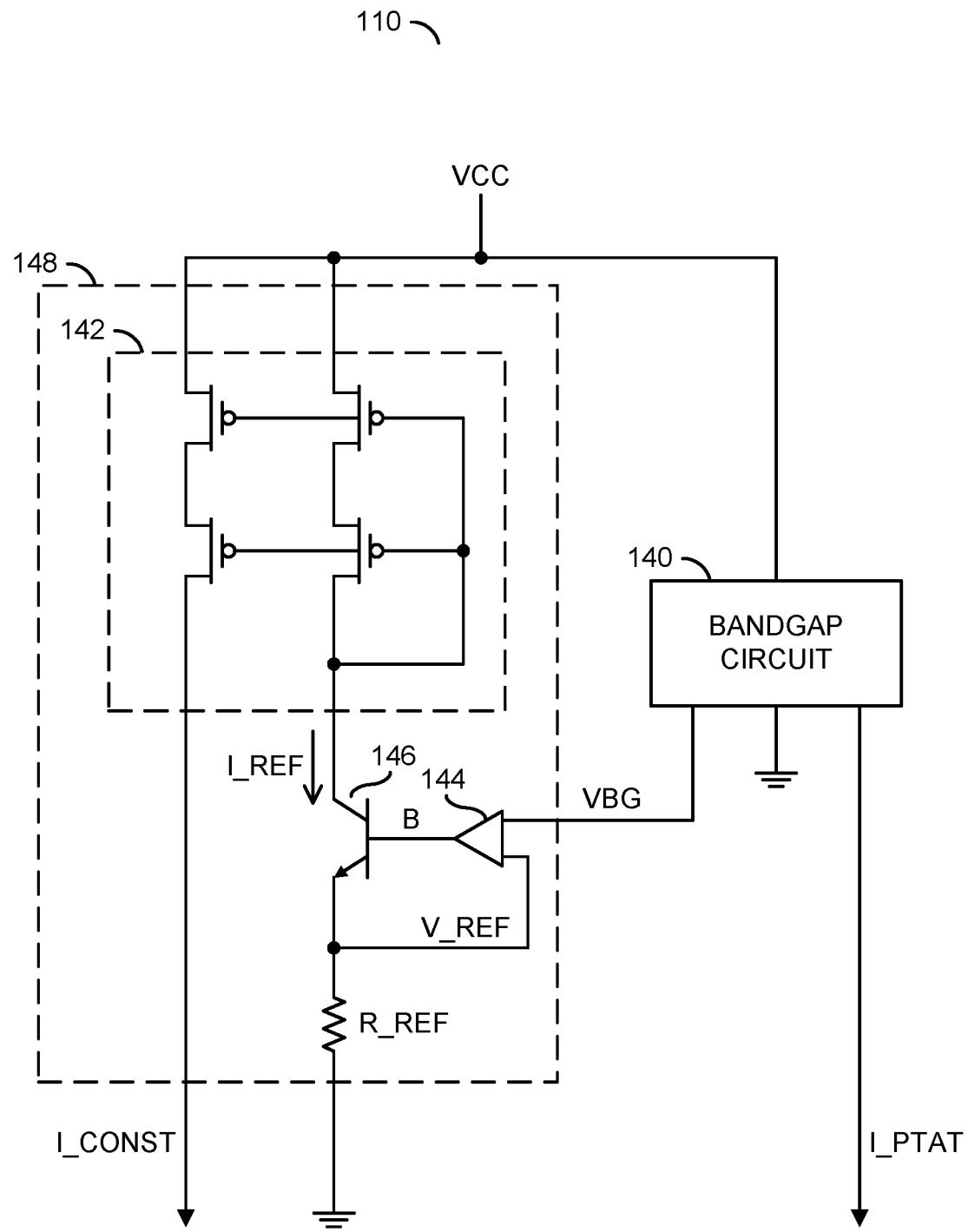
FIG. 4 is a diagram illustrating a reference circuit in accordance with an example embodiment of the invention.

Referring to FIG. 4, a diagram illustrating an implementation of the reference circuit 110 is shown in accordance with an example embodiment of the invention. The reference circuit 110 generally comprises a block (or circuit) 140, a block (or circuit) 142, a block (or circuit) 144, a block (or circuit) 146 and a resistor R_REF. The blocks 142-146 and the resistor R_REF may form a block (or circuit) 148. The circuits 140-148 and the resistor R_REF may be implemented with hardware and/or simulated with software. In various embodiments, the circuits 140-148 may be implemented as one or more integrated circuits.

The circuit 140 may implement a bandgap circuit. The bandgap circuit 140 is generally operational to create the signal I_PTAT and a signal (e.g., VBG). The signal VBG may convey a constant bandgap voltage. The bandgap voltage may be independent of the temperature of the circuit 110 and independent of the supply voltage VCC.

The circuit 142 may implement a current mirror circuit. The circuit 142 is generally operational to generate the signal I_CONST to mirror a current (e.g., I_REF). The current I_REF may be controlled by the circuit 146 and the resistor RREF and may be given by formula (1) as follows:

$$I\_REF = VBG/R\_REF \qquad (1)$$

The circuit 144 may implement a differential amplifier. The amplifier 144 is generally operational to create a voltage (e.g., B) as a difference between the voltage VBG and a voltage (e.g., V_REF). The voltage V_REF may be a reference voltage generated by the current I_REF flowing through the reference resistor R_REF.

The circuit 146 may implement a transistor. In various embodiments, the transistor 146 may be an NPN bipolar transistor. A base node of the transistor 146 may receive the voltage B generated by the amplifier 144. An emitter node of the transistor 146 may be connected to the resistor R_REF. A collector node of the transistor 146 may be connected to one side of the current mirror circuit 142.

The circuit 148 may implement a transconductance amplifier circuit. The amplifier 148 is generally configured to generate the constant current in the signal I_CONST in response to the reference voltage in the signal VBG. The amplifier 148 generally comprises the current mirror 142, the amplifier 144, the transistor 146 and the resistor R_REF. The signals I_CONST and I_PTAT may be presented to the resistance circuit 112. If the resistor R_REF is implemented off-chip, the resistor R_REF may be used to fine tune the gain of the amplifier 90.

Figure 5:
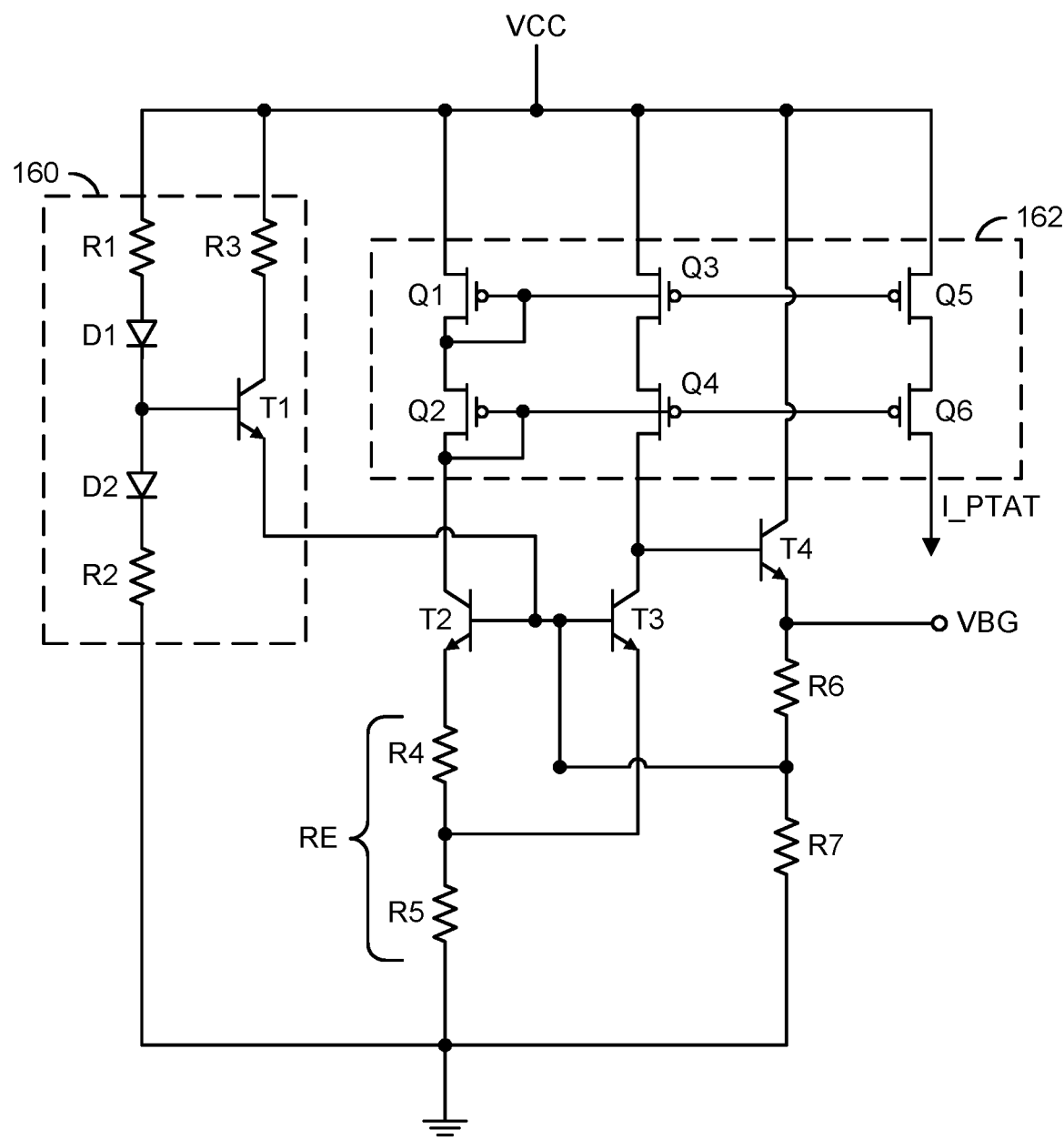
FIG. 5 is a diagram illustrating a bandgap circuit in accordance with an example embodiment of the invention.

Referring to FIG. 5, a diagram illustrating an implementation of the bandgap circuit 140 is shown in accordance with an example embodiment of the invention. The circuit 140 generally comprises multiple transistors T1-T4, multiple transistors Q1-Q6, multiple diodes D1-D2 and multiple resistors R1-R7. The transistors T1-T4 and Q1-Q6, the diodes D1-D2 and the resistors R1-R7 may be implemented with hardware and/or simulated with software. The transistors T1-T4 and Q1-Q6, the diodes D1-D2 and the resistors R1-R7 may be implemented with hardware and/or simulated with software. In various embodiments, the circuits 160-162, the transistors T1-T4, the transistors Q1-Q6, the diodes D1-D2 and the resistors R1-R7 may be implemented as one or more integrated circuits.

The transistor T1, the resistors R1-R3 and the diodes D1-D2 may be configured as a startup circuit 160. The startup circuit 160 is generally operational to ensure that the transistors T2 and T3 power up into a stable condition. Other startup circuit designs may be implemented to meet the design criteria of a particular application.

The transistors Q1-Q6 may be arranged as a current mirror. The transistors Q5-Q6 may generate the signal I_PTAT based on the currents flowing through the transistor pair Q1-Q2.

The transistors T2 and T3 and the resistors R4 and R5 may be configured to generate different currents in the transistor pairs Q1-Q2 and Q3-Q4. The different currents result in different current densities in the transistors T2 and T3. As a result, a proportional to absolute temperature (PTAT) current may flow through the transistors T2, Q1 and Q2. The current in the transistors Q1 and Q2 may be mirrored through the transistors Q5 and Q6. A series combination of the resistors R4 and R5 may form a resistor RE.

The transistors T4 and the resistors R6 and R7 may be arranged as an emitter follower. The voltage generated at the collector node of the transistor T3 may be translated into the emitter node voltage of the transistor T4. The emitter node voltage of the transistor T4 may be presented as the signal VBG.

The current in the signal I_PTAT may be dependent on the temperature (e.g., T) of the circuit 110 and given by formula 2 as follows:

$$I\_PTAT = \alpha T/RE \qquad (2)$$

where $\alpha$ is a constant. The current in the signal I_CONST may be independent of the temperature T of the circuit 110 and given by formula 3 as follows:

$$I\_CONST = 5 \times VBG/R\_REF \qquad (3)$$

The resistance R_RF created by the circuit 124 may be varied based on the temperature T and the voltage conveyed by the signal VBG per formula 4 as follows:

$$R\_RF = T \times R\_REF \times (RA/RE) \times (\alpha/(5 \times VBG)) \qquad (4)$$

By implementing the resistor R_REF off-chip, the resistor R_REF may be used to fine-tune the gain of the amplifier 90.

In an example implementation, an on-resistance R_RF for the circuit 100 may be achieved using four transistors in the circuit 122 and eight transistors in the circuit 124. The resistor RX may have a resistance value of 420 ohms. The resistor 2*RX may have a resistance value of 840 ohms. Channel lengths of the transistors may be 320 nanometers. The channel width W may be 200 micrometers. The resistors RX and 2*RX generally reduce the voltages across the associated transistors to improve linearity. More transistors may be stacked in series to improve linearity. The overall resistance R_RF may be proportional to the absolute temperature of the amplifier 90.

Figure 6:
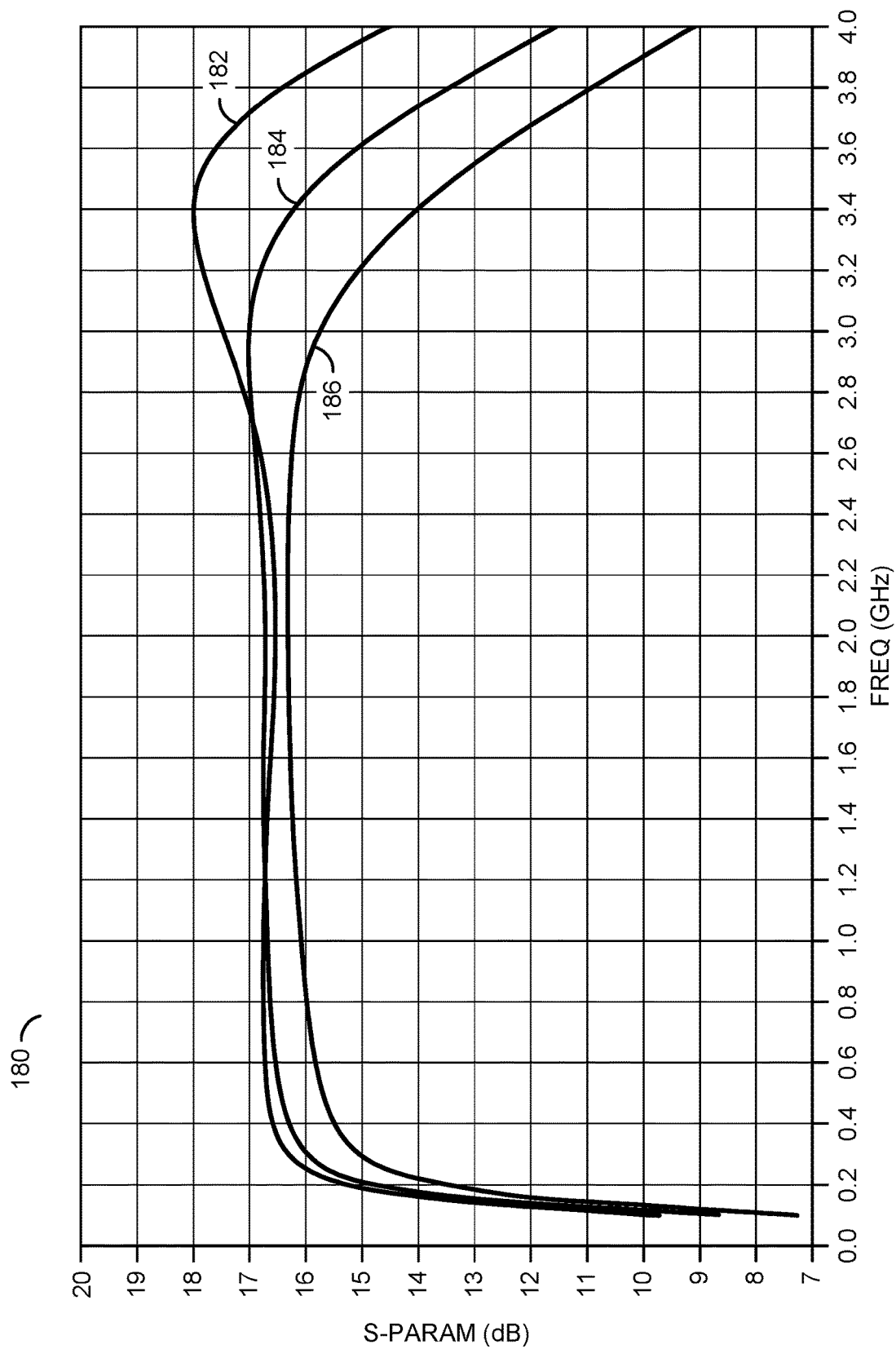
FIG. 6 is a graph illustrating a gain with loop-controlled on-resistance for the feedback resistor in accordance with an example embodiment of the invention.

Referring to FIG. 6, a graph 180 illustrating an example gain with loop-controlled on-resistance for the feedback resistor R_RF is shown in accordance with an example embodiment of the invention. A curve 182 may illustrate the gain at a temperature of approximately 105 degrees Celsius. A curve 184 generally illustrates the gain at a temperature of approximately 25 degrees Celsius. A curve 186 may illustrate the gain at a temperature of approximately −40 degrees Celsius. The curves 182-186 generally show that the gain variation over temperature may be less than ±0.45 dB over a frequency range of approximately 0.6 gigahertz (GHz) to approximately 2.7 GHz.

Figure 7:
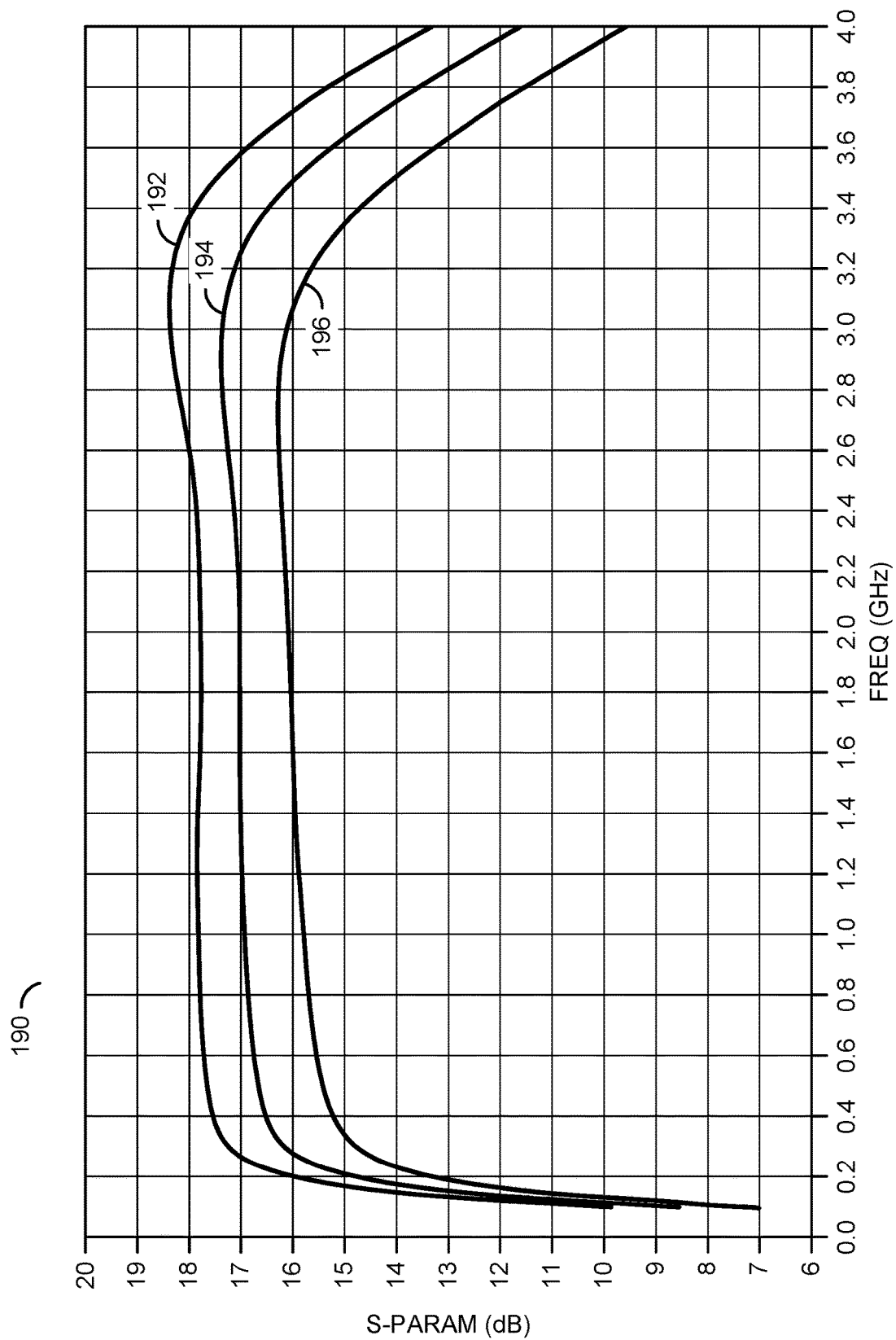
FIG. 7 is a graph illustrating a gain with the feedback resistor implemented with a common resistor.

Referring to FIG. 7, a graph 190 illustrating a gain with the feedback resistor R_RF implemented with a common resistor is shown. A curve 192 may illustrate the gain at a temperature of approximately 105 degrees Celsius. A curve 194 generally illustrates the gain at a temperature of approximately 25 degrees Celsius. A curve 196 may illustrate the gain at a temperature of approximately −40 degrees Celsius. The curves 192-196 generally show that the gain variation over temperature may be less than ±1.10 dB over the frequency range of approximately 0.6 GHz to approximately 2.7 GHz.

Figure 8:
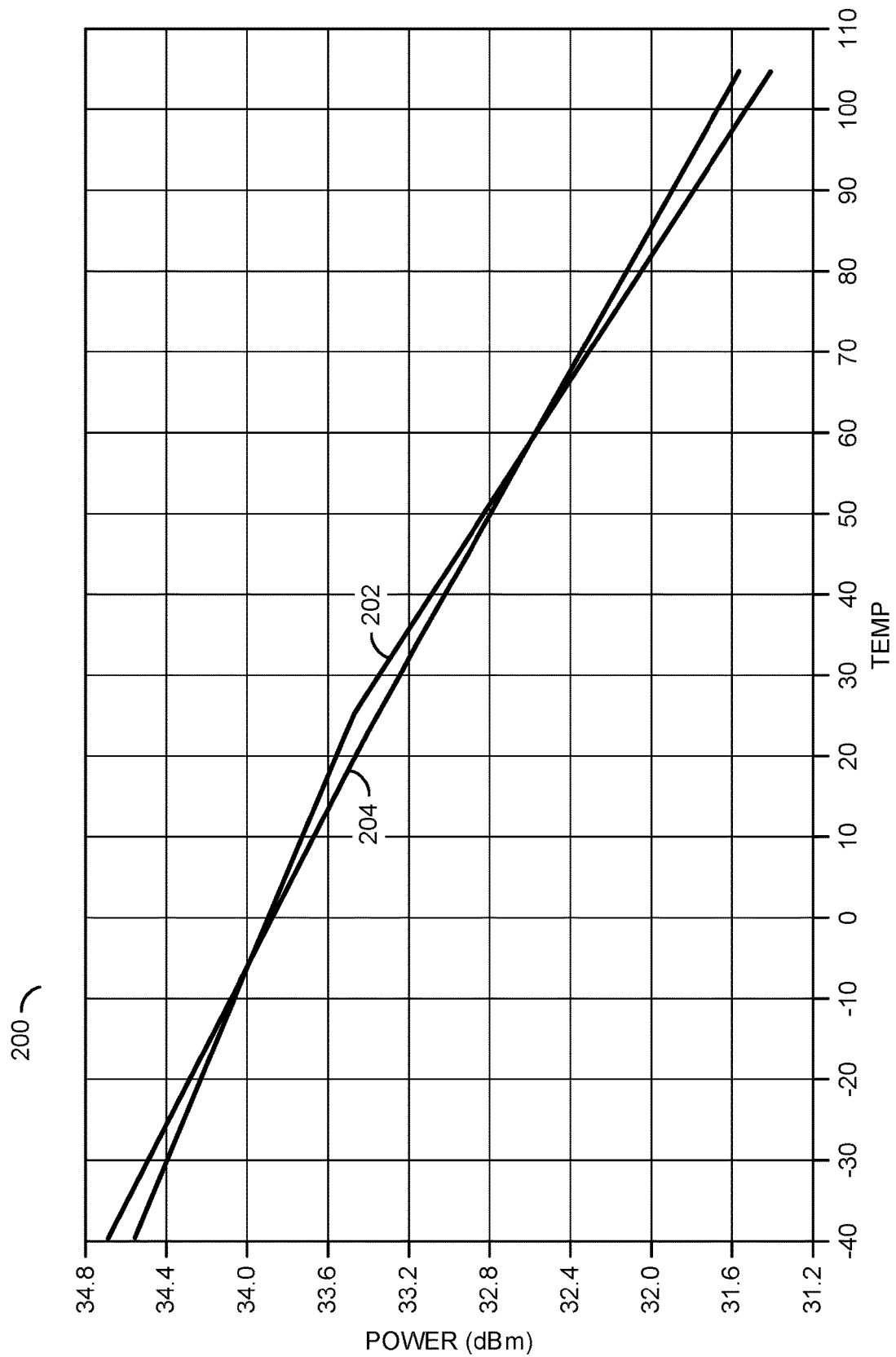
FIG. 8 is a graph illustrating a third-order intercept point vs. temperature in accordance with an example embodiment of the invention.

Referring to FIG. 8, a graph 200 illustrating a third-order intercept point (OPI3) vs. temperature is shown in accordance with an example embodiment of the invention. The third-order intercept point may be based on the signal IN having a frequency of approximately 2.3 GHz. A curve 202 may illustrate the third-order intercept point with the feedback resistor R_RF implemented with a common resistor. A curve 204 generally illustrates the third-order intercept point with the circuit 100 incorporated into the amplifier 90. The graph 200 generally illustrates that the field-effect transistor on-resistance of the circuit 100 does not degrade linearity.

The functions and structures illustrated in the diagrams of FIGS. 1 to 8 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a first circuit configured to generate (i) a variable current and (ii) a constant current, wherein said constant current is presented at a first output of said first circuit, said variable current is presented at a second output of said first circuit, and said variable current is proportional to a temperature of said first circuit; and
   a second circuit comprising a first input, a second input, a first port, and a second port, wherein (i) said first input receives said constant current, (ii) said second input receives said variable current, (iii) said second circuit is configured to control a resistance through a plurality of first transistors connected in series between said first and said second ports in response to said variable current and said constant current, and (iv) said resistance has a predefined dependence on said temperature.

2. The apparatus according to claim 1, further comprising an amplifier, wherein said first and said second ports of said second circuit are connected in a feedback loop between an output node of said amplifier and an input node of said amplifier.

3. The apparatus according to claim 2, wherein said predefined dependence of said resistance on said temperature is configured to counteract a gain dependency of said amplifier on said temperature to smooth a gain variation of said amplifier over variation of said temperature.

4. The apparatus according to claim 1, wherein said first circuit comprises (i) a bandgap circuit configured to generate (a) a reference voltage that is independent of said temperature and (b) said variable current and (ii) a transconductance amplifier configured to generate said constant current in response to said reference voltage.

5. The apparatus according to claim 1, wherein said second circuit comprises (i) a first resistor configured to generate a first voltage by routing said variable current to a common node, (ii) a plurality of second transistors connected in series and configured to generate a second voltage by routing said constant current to said common node, and (iii) an amplifier configured to generate a control signal in response to said first voltage and said second voltage.

6. The apparatus according to claim 5, wherein said control signal generated by said amplifier is configured to control a conductance of (i) said first transistors and (ii) said second transistors.

7. The apparatus according to claim 5, wherein each of said first transistors has a wider channel than said second transistors.

8. The apparatus according to claim 5, further comprising a second resistor configured to connect said common node to an intermediate node among said first transistors.

9. The apparatus according to claim 8, wherein:
   a first number of said first transistors are connected in series between said first port and said intermediate node; and
   a second number of said first transistors are connected in series between said intermediate node and said second port.

10. A method for creating a controlled transistor on-resistance, comprising the steps of:
    generating a variable current, wherein said variable current is proportional to a temperature of a circuit;
    generating a constant current; and
    controlling a resistance through a plurality of first transistors connected in series between a first port and a second port of said circuit in response to said variable current and said constant current, wherein said resistance has a predefined dependence on said temperature.

11. The method according to claim 10, further comprising the step of:
   connecting said circuit as a feedback loop of an amplifier by connecting said first port to an output node of said amplifier and connecting said second port to an input node of said amplifier.

12. The method according to claim 11, wherein said predefined dependence of said resistance on said temperature is configured to counteract a gain dependency of said amplifier on said temperature to smooth a gain variation of said amplifier over variation in said temperature.

13. The method according to claim 10, further comprising:
   generating a reference voltage that is independent of said temperature; and
   generating said constant current in response to said reference voltage.

14. The method according to claim 10, further comprising the steps of:
   generating a first voltage by routing said variable current through a first resistor to a common node;
   generating a second voltage by routing said constant current through a plurality of second transistors to said common node; and
   generating a control signal in response to said first voltage and said second voltage.

15. The method according to claim 14, wherein said control signal is configured to control a conductance of (i) said first transistors and (ii) said second transistors.

16. The method according to claim 14, wherein each of said first transistors has a wider channel than said second transistors.

17. The method according to claim 14, further comprising a second resistor configured to connect said common node to an intermediate node among said first transistors.

18. The method according to claim 17, wherein (i) said second transistors are connected in series, (ii) a first number of said first transistors are connected in series between said first port and said intermediate node, and (iii) a second number of said first transistors are connected in series between said intermediate node and said second port.

19. The method according to claim 18, further comprising:
   connecting a third resistor between said first port and said first number of first transistors; and
   connecting a fourth resistor in series with said second transistors.

20. The apparatus according to claim 9, further comprising:
   a third resistor connected between said first port and said first number of first transistors; and
   a fourth resistor connected in series with said second transistors.

* * * * *